(12) United States Patent
Fong et al.

(10) Patent No.: US 7,089,661 B2
(45) Date of Patent: Aug. 15, 2006

(54) METHOD FOR PACKAGING SMALL SIZE MEMORY CARDS

(75) Inventors: Piau Fong, Gelugor (MY); Chee Kiang Yew, Singapore (SG); Colin Chun Sing Lum, Singapore (SG); Matthew Keng Siew Chua, Bayan Baru (MY)

(73) Assignee: Flex-P Industries Sdn Bhd.

( * ) Notice: Subject to any disclaimer, the term of this patent is extended or adjusted under 35 U.S.C. 154(b) by 466 days.

(21) Appl. No.: 10/412,731

(22) Filed: Apr. 11, 2003

(65) Prior Publication Data
US 2004/0201969 A1  Oct. 14, 2004

(51) Int. Cl.
*H05K 3/30* (2006.01)
*H05K 1/14* (2006.01)

(52) U.S. Cl. ............... 29/841; 29/412; 29/417; 29/830; 29/832; 29/842; 29/855; 361/737

(58) Field of Classification Search ............. 29/841, 29/842, 832, 855, 852, 412, 417, 830; 361/737, 361/736, 818; 264/272.17, 272.11; 257/679, 257/684, 681
See application file for complete search history.

(56) References Cited

U.S. PATENT DOCUMENTS 5,689,137 A * 11/1997 Weber .................. 257/679
5,895,222 A * 4/1999 Moden et al. ............ 438/4
6,000,924 A * 12/1999 Wang et al. ............ 425/125
6,128,195 A * 10/2000 Weber et al. ........... 361/737
6,484,394 B1 * 11/2002 Heo et al. ............... 29/841

* cited by examiner

*Primary Examiner*—A. Dexter Tugbang
*Assistant Examiner*—Tai Nguyen
(74) *Attorney, Agent, or Firm*—Lawrence Y.D. Ho & Assoc.

(57) ABSTRACT

A method is disclosed for packaging a small size memory card, including xD Picture card, Memory Stick™, Secure Digital™ (SD) card, SmartMedia™ (SM) card, Multimedia card (MMC), CompactFlash™ (CF) card and PC card, by moulding over to encapsulate a populated printed circuit board (PCB) (10) to form the standard external dimensions and features of the memory card.

The method comprises holding the populated PCB (10) in place in a cavity (44) of at least one mould piece; and moulding over both sides of the populated printed circuit board (10) to encapsulate said board. Various embodiments are disclosed, including means for holding the populated PCB (10) in the moulding cavity (44) for the encapsulation process, which includes transfer moulding and injection moulding processes, one or more moulding steps, and moulding over one part of one side of said board before the other side, and/or simultaneously moulding over both sides of said board.

28 Claims, 3 Drawing Sheets

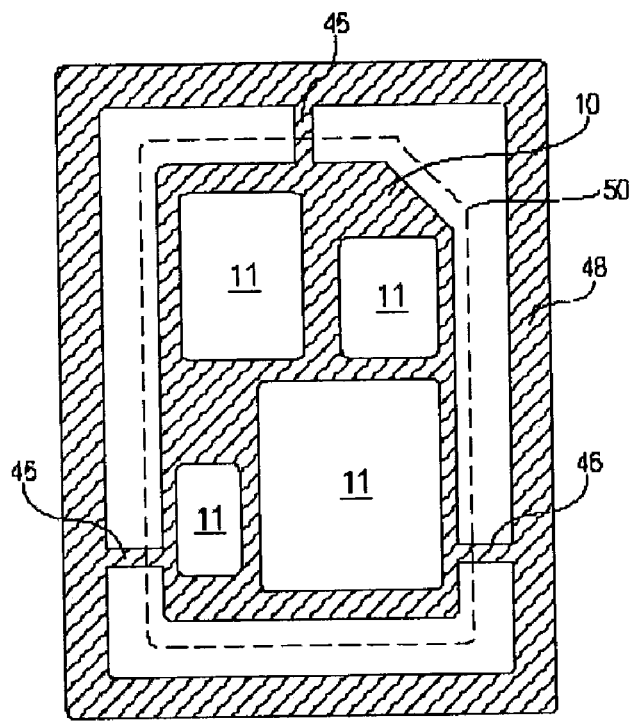
FIGURE 3
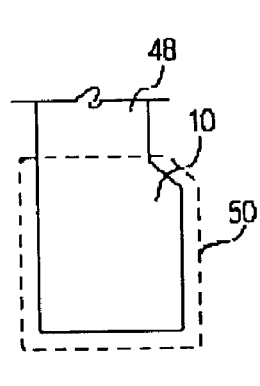
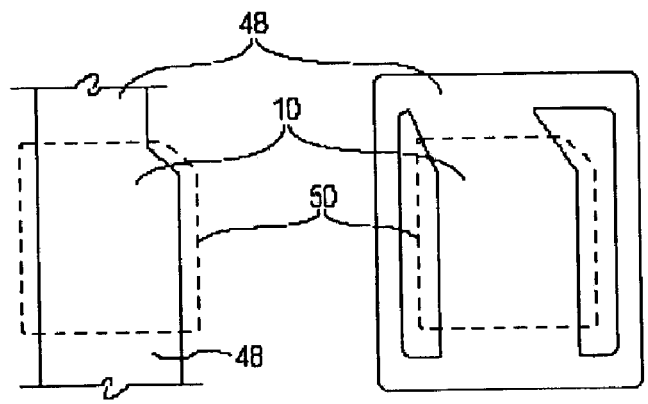
FIGURE 4A    FIGURE 4B    FIGURE 4C

METHOD FOR PACKAGING SMALL SIZE MEMORY CARDS

TECHNICAL FIELD

This invention relates to a method for forming a small size memory card, including Secure Digital™ (SD) card, SmartMedia™ (SM) card, Multimedia card (MMC), CompactFlash™ (CF) card, PC card, Memory Stick™ and xD Picture card by moulding or encapsulation.

BACKGROUND ART

Small size memory card, including xD Picture card, Secure Digital™ (SD) card, SmartMedia™ (SM) card, Multimedia card (MMC), CompactFlash™ (CF) card and PC card are assembled by first making the printed circuit board (PCB) with the contact pads and mounting points for components including microchips (11) such as flash memory, micro-controller, etc. to be mounted thereunto as shown schematically in FIG. 1 (Prior Art). Once the components are mounted, the populated PCB (10) is then fitted into a 2-piece plastic or metal housing (12, 14) which may be snapped fit to close and sealed by microwave or ultrasound leaving certain parts such as the contact pads (16) exposed via openings (18).

In addition to the additional step of assembling the 2-piece housing (12, 14) to sandwich the populated PCB (10) within, the nature of such housing requires certain tolerances which results in minimum gaps or spaces within to allow the PCB to be fitted therein and avoid damaging the components if the 2 parts of the housing are being snapped too hard to fit and close. Such spaces, in turn, enable the assembled card to flex under stress, which may eventually lead to the 2-piece housing to delaminate, crack, separate, and/or solder joints of the components on the PCB to deteriorate or weaken due to the flexing of the PCB.

Another weakness of this conventional construction is the space behind the contact pads, which is also frequently subjected to stress as the card is inserted into a device to be read and removed. Some form of padding or reinforcement is required behind this area to counter the stress, which otherwise may cause the PCB to flex within the housing. Accordingly, the conventional housing provides for a thickening of the area (20) corresponding to the PCB's other side of the contact pads to provide the requisite support. To avoid a resulting weakened or fault line from a rapid fall in thickness of the housing piece, a tapering (22) is usually provided to gradually decrease the thickness which renders an even larger area of the PCT to be unpopulated (24).

The 2-piece housing structure also places a minimal thickness factor on each of the 2 pieces of the housing, thus reducing the internal space, especially thickness, for e.g. increasing memory storage space by increasing the number of memory chips mountable on the PCB. Minimum wall thickness is limited by the high pressure required to fill at a large width-to-thickness ratio, as well as difficulty in removing thin parts from the mould.

OBJECTS OF THE INVENTION

The present invention endeavours to overcome the above shortcomings by avoiding the steps of (i) moulding separately the two pieces of housing, (ii) assembling the 2-piece housing into the complete memory card, and (iii) sealing the said housing pieces together by ultrasound or microwave.

The invention further allows the memory card to be packaged in a housing without the need for tolerances to fit the corresponding component profile of the populated PCB therewithin. The resultant moulded card according to the invention further provides for a sturdy, integral packaging, which prevents the assembled card from flexing under stress.

The construction of the card according to the present method also enables the area behind the contact pads of the PCB to be populated with components without foregoing the reinforcing or padding aspect.

The moulding method of the invention is not limited by minimum thickness of individual housing pieces, thus maximises the internal space, particularly thickness, of the memory card available for populating chips on the PCB.

STATEMENT OF INVENTION

According to the general embodiment of the invention, the method for packaging a small size memory card comprising moulding over to encapsulate a populated printed circuit board to form the standard external dimensions and features of said memory card.

Preferably, the "printed circuit board" (PCB) covers circuits board of a substantially rigid type suitable for withstanding process handling and encapsulation of the present invention, including glass and ceramic laminates such as Bismaleimide/Triazine (BT), FR4 and FR5 (glass cloth/epoxy), and other suitable materials.

In one aspect of the invention, the method comprises providing the populated PCB and moulding over both sides of the populated PCB to encapsulate the board. Preferably, the populated PCB is held in place in a cavity of at least one mould piece prior to the moulding. In one preferred embodiment, the populated PCB comprises at least one tie bar extending therefrom, and wherein holding the populated PCB in place in the cavity of the at least one mould piece comprises securing the at least one tie bar in place in the cavity of the at least one mould piece.

Preferably still, the tie bar extends to a peripheral frame which integrally and substantially surrounds the populated PCB, thereby holding the populated PCB in place in the cavity of the one mould piece by securing a portion of the peripheral frame. The peripheral frame may preferably be provided with a plurality of tie bars, which are optimally distributed around said peripheral frame to prevent flexure of said populated PCB as it is held within the mould piece.

In another aspect of the invention, one edge of the populated PCB may be provided for holding said board in place for the encapsulating process in the mould piece. Preferably, one or more perforation through the PCB may be provided to allow for the moulding compound to flow therethrough during encapsulation to provide for integral connection between said moulding compound on the two sides of the PCB.

The complete encapsulated memory card may be separated from the holding means by conventional methods including any one of scribing-and-breaking, sawing, punching and cutting. The encapsulation process may include any one or combination of transfer moulding and injection moulding processes.

Preferably, the encapsulation is achieved with one-step moulding, including any one of combination of moulding over one side prior to the other side of the populated PCB, part of one side of said board, and simultaneously encapsulating over both sides of said board.

In a specific embodiment, the populated PCB may include chip-on-board (COB) or multiple chip modules components mounted thereon, including direct flip chip on board (FCOB), wire-bonded chips and other forms of interconnect between the chip and the PCB. Preferably, the FCOB is a flash memory chip module, including any one of a solder-bumped flip chip, wire-bonded chip and other forms of interconnect between the chip and the PCB, packaged on a land-grid array (LGA) chip scale package (CSP).

In yet another aspect of the invention, the standard external dimensions and features of the memory card may include any one or combination of openings for contact pads or pins extending from the PCB and write-protect means. Preferably, the write-protect means is completed with a separate member inserted into a groove provided with the encapsulated card and slidable along said groove.

The method of the invention may be used to manufacture a small size memory card including xD picture card, Memory Stick™, Secure Digital ™ (SD) card, SmartMedia™ (SM) card, Multimedia card (MMC), CompactFlash™ (CF) card and PC card.

BRIEF DESCRIPTION OF DRAWINGS

The moulding method of the present invention will be better understood with the following detailed description with reference to the drawings, which describes an embodiment as an example or illustration, in which FIG. 1 (Prior art) shows a schematic configuration of a conventional memory card in cross-sectional view;

FIG. 3 shows one embodiment of the tie-bar configuration of the populated PCB in plan view;

FIGS. 4A, 4B and 4C show other embodiments of the tie-bar configurations of the populated PCB in plan view;

DETAILED DESCRIPTION OF SPECIFIC EMBODIMENT

The following description discloses the specific embodiment of a Secure Digital (SD) card as an example application of the method of the invention. It is to be understood that the method is applicable to other types of small size memory cards including SmartMedia™ (SM) card, Multimedia card (MMC), CompactFlash™ (CF) card, PC card, Memory Stick™, xD Picture card and like small size memory cards which formats and specifications may be introduced in the future.

Figure 1:
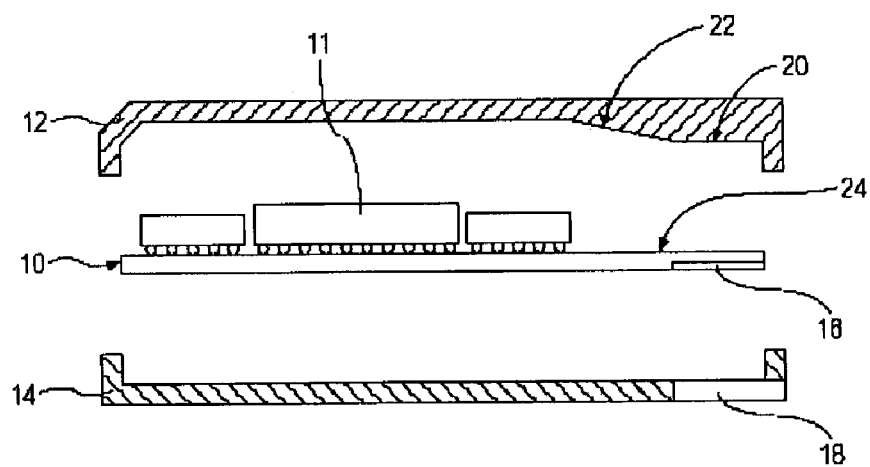
Figure 2:
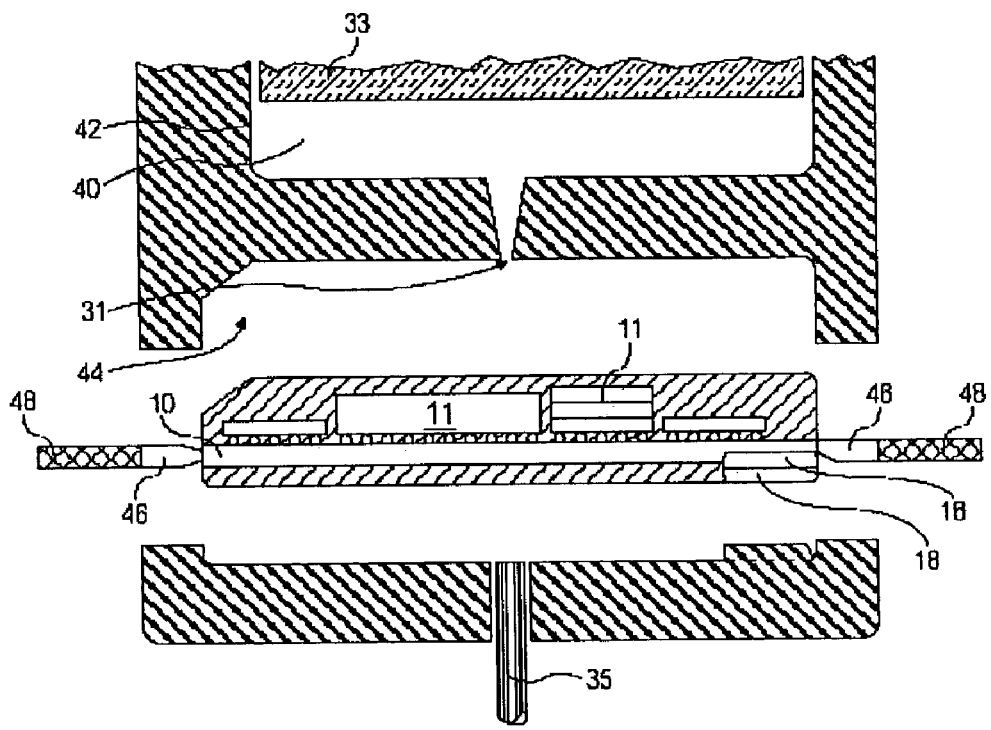
FIG. 2 shows a schematic configuration of a memory card moulded with the present invention in cross-sectional view.

FIG. 2 shows in cross-sectional view a suggested arrangement of the moulding process enabling the encapsulation of the populated PCB (10). The general embodiment comprises providing the populated PCB in a mould, which has been tooled to form the standard external dimensions and features of the designated memory card, and then push an amount of moulding polymer (40) at high pressure into the mould cavity to flow over both sides of the populated PCB (10) and encapsulate it.

Although various moulding techniques such as reaction injection moulding, compression moulding and transfer moulding may be adapted for the present invention, transfer moulding is particularly favoured due to the moulding polymer (40) acquiring uniform temperature and properties in the transfer pot (42) prior to transfer. The molten polymer (40) may further be heated by shearing through the sprue (31), thus reducing viscosity and enabling the plastic to fill intricate details of the mould cavity upon the high pressure exerted by the punch (33). The low viscosity also reduces the damage to delicate wires and components of the PCB and is thus favoured in encapsulation of electronic devices. Upon the curing of the polymer, ejector (35) or knockout pin may be provided to eject the completed memory card from the lower mould piece (37).

It is to be appreciated that various moulding step may be used to achieve the encapsulation, such as a two-step moulding, including any one of combination of moulding over one side prior to the other side of the populated PCB, part of one side of said board, and simultaneously moulding over both sides of said board.

To provide the populated PCB (10) in the moulding cavity (44), the PCB may be fabricated with one or more tie bars (46) linking it to a peripheral frame (48) as shown more clearly in plan view of FIG. 3. The provision of the peripheral frame enables the populated PCB to be held in place in the moulding cavity (44) for the encapsulation process to produce the memory card which shape is shown in outline (50). Upon the polymer being cured, the tie bars (46) may be broken to separate the complete memory card from the peripheral frame (48).

Apart from providing tie bars (46) and distribute them accordingly around the peripheral frame (48), it is also possible to provide the peripheral frame (48) integral with the populated PCB (10) along any one or more edges of the PCB as shown in FIGS. 4A, 4B, and 4C. To ease the detachment of the completely encapsulated memory card from the edge integral with the peripheral frame (48), various conventional means such as scribe-and-break, sawing, cutting and punching may be employed.

Figure 5:
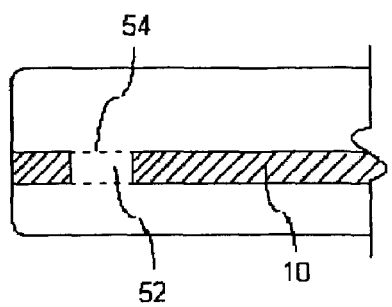
FIG. 5 shows one embodiment of perforation of the PCB in cross-sectional view.

It may be anticipated that such encapsulated with an exposed edge, which may be seen on the edge of the finished memory card, may not be as sturdy as the embodiment where the edges are well encapsulated and may even delaminate when flexed or undergoing warpage stress. One way to ameliorate this problem is to provide perforation (52) on the PCB proximate to the edge so that the encapsulating compound (54) may flow through and form an integral joint between the two sides of the PCB as shown in cross-sectional view in FIG. 5.

The populated PCB may include various components on board such as chip-on-board (COB) and multiple chip modules (MCM). The chip-on-board component (COB) may be mounted onto the board as direct flip chip on board (FCOB) which may include flash memory module. The flash memory chip module may be a solder-bumped flip chip, or wire-bonded chip, or any combination of both, packaged on a land-grid array (LGA) chip scale package (CSP). Alternatively, the flip chip on board, or wire-bonded chip(s), may be mounted on a low-profile ball grid array (BGA).

It will be appreciated that the mould piece may be tooled to include the standard external dimensions and features of the memory card including openings for contact pads or pins extending from the PCB and write-protect means.

In respect of the write-protect means, the conventional write-protect switch is provided as a separate switch piece slidable along a groove between the "write-enable" position and the "write-protect" position. The switch piece may be easily inserted in place in the groove when the 2-piece housing is assembled. For the memory card encapsulated according to the present invention, this pose a problem.

Figure 6A:
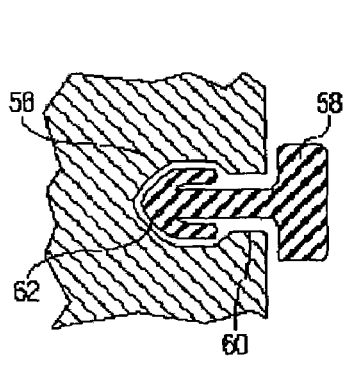
FIGS. 6A, 6B, 6C, and 6D show alternative embodiments of the slidable write-protection switch.
Figure 6B:
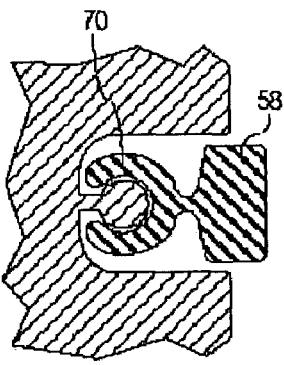
Figure 6C:
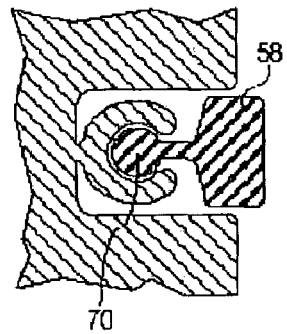

As shown in FIGS. 6A, 6B and 6C, it is proposed that the groove (56) be provided in the same configuration with, e.g. a 2-piece mould, and the slidable switch (58) be provided as a separate piece to be inserted and retained in the groove (56). In FIG. 6A, the groove (56) may be provided with a constricted neck portion (60) and the switch (58) provided with a flexible barbed end (62) so that th end may be inserted into the groove (56) as the barbs are flexibly contracted to pass through the neck portion (58). Once the barbs (62) reflex to their expanded state the switch is retained in the groove and slidably therealong. In FIGS. 6B and 6C, the slidable switch's mountings are shown as ball-and-socket connections.

Figure 6D:
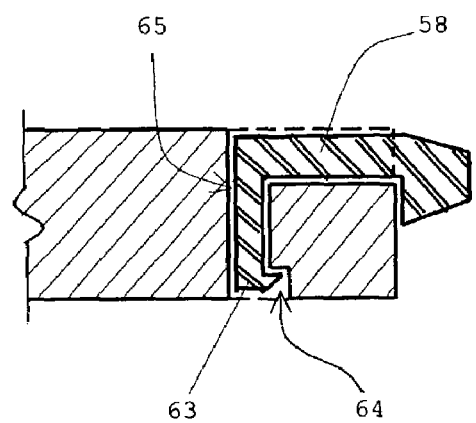

In FIG. 6D, the slide switch (58) is retained in the moulding by ways of flexible barbed end (63) which may be inserted into the groove (64) whereupon the barbs flexibly contract to enable the end (63) to pass through the opening (65). Once the barbs (66) reflex to their expanded state the switch (58) is retained in the groove and slidably therealong.

It will be appreciated that, apart from the write-protect switch, other external features of the particular type of memory card may be similarly improvised for in the present one-piece encapsulating housing. From the above description on the SD card, it would be obvious to a person skilled in the art that there are many variations and alternative embodiments that may be possibly used in substitution of the aforesaid parts, materials, steps or processes in respect of the same memory card type or other types of small size memory cards such as SmartMedia™ (SM) card, Multimedia card (MMC), CompactFlash™ (CF) card, PC card, Memory Stick™ and xD Picture card.

Many of the parts, components, materials and configurations may be modified or varied, which are not specifically described herein, may be used to effectively work the concept and working principles of this invention. They are not to be considered as departures from the invention and shall be considered as falling within the letter and scope of the following claims.

The invention claimed is:

1. A method for packaging a small size memory card comprising moulding over to encapsulate a populated printed circuit board (10) to form the standard external dimensions and features of said memory card; wherein the populated printed circuit board (10) includes chip-on-board (COB) component mounted thereon; wherein the chip-on-board component (COB) is mounted onto the board as any one of direct flip chip on board (FCOB), wire-bonded chips and other forms of interconnect between the chip and the PCB; and wherein the FCOB is a flash memory module.

2. A method according to claim 1 wherein moulding comprises:
   providing the populated printed circuit board (10); and
   moulding over both sides of the populated printed circuit board (10) to encapsulate said board.

3. A method according to claim 2 prior to moulding comprises holding the populated printed circuit board (10) in place in a cavity of at least one mound piece.

4. A method according to claim 3 wherein the populated printed circuit board (10) comprises at least one tie bar (46) extending therefrom, and wherein holding the populated printed circuit board (10) in place in the cavity of the at least one mould piece comprises securing the at least one tie bar (46) in place in the cavity (44) of the at least one mould piece.

5. A method according to claim 4 wherein the at least one tie bar (46) extends to a peripheral frame (48) which integrally and substantially surrounds the populated printed circuit board (10) thereby holding the populated printed circuit board (10) in place in the cavity (44) of the at least one mould piece by securing at least a portion of the peripheral frame (48).

6. A method according to claim 5 wherein the peripheral frame (48) is provided with a plurality of tie bars (46) which are optimally distributed around said peripheral frame (48) to prevent flexure of said populated printed circuit board (10) held within the at least one mould piece.

7. A method according to claim 3 wherein at least one edge of the populated printed circuit board (10) is provided for holding said board in place for the encapsulating process in the at least one mould piece.

8. A method according to claim 7 wherein one or more perforation (52) through the printed circuit board (10) are provided to allow for the moulding compound to flow therethrough during encapsulation to provide for integral connection between said moulding compound on the two sides of the printed circuit board (10).

9. A method according to claim 1 wherein the complete encapsulated memory card is separated from the holding means by conventional methods including any one of scribing-and-breaking, sawing, punching and cutting.

10. A method according to claim 1 wherein the encapsulation process includes any one or combination of transfer moulding and injection moulding processes.

11. A method according to claim 10 wherein the encapsulation is achieved with an at least one-step moulding, including any one of combination of moulding over one side prior to the other side of the populated printed circuit board (10), part of one side of said board, and simultaneously encapsulating over both sides of said board (10).

12. A method according to claim 1 wherein the populated printed circuit board (10) includes multiple chip modules (MCM) component mounted thereon.

13. A method according to claim 1 wherein the flash memory chip module includes any one of a solder-bumped flip chip, wire-bonded chip and other forms of interconnect between the chip and the PCB, packaged on a land-grid array (LGA) chip scale package (csp).

14. A method for packaging a small size memory card comprising moulding over to encapsulate a populated printed circuit board (10) to form the standard external dimensions and features of said memory card; wherein the standard external dimensions and features of said memory card include any one or combination of openings (18) for contact pads (16) or pins extending from the printed circuit board (10) and write-protect means.

15. A method according to claim 14 wherein write-protect means is completed with a separate member (58) inserted into a groove (56) provided with the encapsulated card and slidable along said groove (56).

16. A method for packaging a small size memory card comprising moulding over to encapsulate a populated printed circuit board (10) to form the standard external dimensions and features of said memory card; wherein the populated printed circuit board (10) includes chip-on-board (COB) component mounted thereon; wherein the chip-on-board component (COB) is mounted onto the board as any one of direct flip chip on board (FCOB), wire-bonded chips and other forms of interconnect between the chip and the PCB; and wherein the mounting of the COB on the board is a low-profile ball grind array (BGA).

17. A method according to claim 16 wherein moulding comprises:
  providing the populated printed circuit board (10); and
  moulding over both sides of the populated printed circuit board (10) to encapsulate said board.

18. A method according to claim 17 prior to moulding comprises holding the populated printed circuit board (10) in place in a cavity of at least one mound piece.

19. A method according to claim 18 wherein the populated printed circuit board (10) comprises at least one tie bar (46) extending therefrom, and wherein holding the populated printed circuit board (10) in place in the cavity of the at least one mould piece comprises securing the at least one tie bar (46) in place in the cavity (44) of the at least one mould piece.

20. A method according to claim 19 wherein the at least one tie bar (46) extends to a peripheral frame (48) which integrally and substantially surrounds the populated printed circuit board (10) thereby holding the populated printed circuit board (10) in place in the cavity (44) of the at least one mould piece by securing at least a portion of the peripheral frame (48).

21. A method according to claim 20 wherein the peripheral frame (48) is provided with a plurality of tie bars (46) which are optimally distributed around said peripheral frame (48) to prevent flexure of said populated printed circuit board (10) held within the at least one mould piece.

22. A method according to claim 19 wherein at least one edge of the populated printed circuit board (10) is provided for holding said board in place for the encapsulating process in the at least one mould piece.

23. A method according to claim 22 wherein one or more perforation (52) through the printed circuit board (10) are provided to allow for the moulding compound to flow therethrough during encapsulation to provide for integral connection between said moulding compound on the two sides of the printed circuit board (10).

24. A method according to claim 16 wherein the complete encapsulated memory card is separated from the holding means by conventional methods including any one of scribing-and-breaking, sawing, punching and cutting.

25. A method according to claim 16 wherein the encapsulation process includes any one or combination of transfer moulding and injection moulding processes.

26. A method according to claim 25 wherein the encapsulation is achieved with an at least one-step moulding, including any one of combination of moulding over one side prior to the other side of the populated printed circuit board (10), part of one side of said board, and simultaneously encapsulating over both sides of said board (10).

27. A method according to claim 16 wherein the populated printed circuit board (10) includes multiple chip modules (MCM) component mounted thereon.

28. A method according to claim 16 wherein the flash memory chip module includes any one of a solder-bumped flip chip, wire-bonded chip and other forms of interconnect between the chip and the PCB, packaged on a land-grid array (LGA) chip scale package (csp).

* * * * *